INTEGRATED CIRCUITS COMPRISING FIELD-EFFECT DEVICES

Filed July 29, 1963 6 Sheets-Sheet 1

INVENTORS:

RENE C. SUEUR AND
STANISLAS TESZNER

BY [signature]
ATTORNEY.

INTEGRATED CIRCUITS COMPRISING FIELD-EFFECT DEVICES

Filed July 29, 1963 6 Sheets-Sheet 2

INVENTORS:
RENE C. SUEUR AND
STANISLAS TESZNER

BY

Otto John Munz

ATTORNEY.

March 30, 1965 R. C. SUEUR ETAL 3,176,192

INTEGRATED CIRCUITS COMPRISING FIELD-EFFECT DEVICES

Filed July 29, 1963 6 Sheets-Sheet 3

INVENTORS:
RENE C. SUEUR AND
STANISLAS TESZNER
BY Otto John Munz
ATTORNEY.

INTEGRATED CIRCUITS COMPRISING FIELD-EFFECT DEVICES

Filed July 29, 1963 6 Sheets-Sheet 4

INVENTORS:

RENE C. SUEUR AND
STANISLAS TESZNER

BY [signature]
ATTORNEY.

INTEGRATED CIRCUITS COMPRISING FIELD-EFFECT DEVICES

Filed July 29, 1963 6 Sheets-Sheet 5

INVENTORS:
RENE C. SUEUR AND
STANISLAS TESZNER

BY
Otto John Munz
ATTORNEY.

INTEGRATED CIRCUITS COMPRISING FIELD-EFFECT DEVICES

INVENTORS:
RENE C. SUEUR AND
STANISLAS TESZNER

BY [signature]
ATTORNEY.

United States Patent Office 3,176,192
Patented Mar. 30, 1965

3,176,192
INTEGRATED CIRCUITS COMPRISING FIELD-EFFECT DEVICES

René C. Sueur, 21 Rue Spontini, and Stanislas Teszner, 49 Rue de la Tour, both of Paris, France
Filed July 29, 1963, Ser. No. 298,351
Claims priority, application France, Aug. 3, 1962, 906,102
6 Claims. (Cl. 317—101)

The present invention relates to integrated circuits in which the active elements are field-effect devices known as gridistors.

It is known that the terms, integrated circuit or semiconductor network, are understood to mean an electronic circuit all the elements of which are formed inside or possibly on the surface of a semiconductor crystal by local modifications of the characteristics of the same. In its idealized form, the integrated circuit has nothing accessible except input and output terminals, all the internal connections being integrated in the mass of the semiconductor body.

It will be appreciated that provided the behaviour of these elements is satisfactory, such a circuit offers maximum reliability in operation and maintenance, as well as maximum robustness. Nevertheless, in practice, this object does not yet appear to have been achieved because either the component elements, or their arrangement, or again the lines on which the circuit is made up, scarcely lend themselves to this. Thus the integrated circuit comprising at least two active elements hitherto constructed comprise at least two distinct semiconductor units and external interconnections.

It is the object of the present invention to produce integrated circuits including at least two active elements which only comprise one single semiconductor unit and in which all the interconnections are internal or on the surface of the unit.

Another object of the invention is to provide integrated circuits in which all the active elements are field-effect transistors.

According to one feature of the invention, the active elements of the integrated circuits are field-effect semiconductor devices described in U.S. patent application Ser. No. 243,793, filed by the second-named present applicant on December 11, 1962. These semiconductor devices are now known under the name of gridistors. The gridistor is a field-effect device comprising, in a single unit and in a single semiconductor wafer, which may be parallelepiped for example, two regions in the form of substantially plane layers and of a given type of conductivity, joined to one another by a plurality of rod-shaped regions perpendicular to said plane regions and of the same type of conductivity, said rod-shaped regions being embedded in an intermediate region situated between said two plane regions, of the opposite type of conductivity and forming the "wires" of a gate or grid, the "holes" in which wuold be the rod-shaped regions. Ohmic terminal electrodes are provided on the two faces of the wafer and constitute the source and drain electrodes or, when the conductivity type of the wafer is well-defined, the cathode and the anode (these expressions will be retained hereinafter) and the gate may be connected to an electrode in ohmic contact with it and situated on one or the other of the faces of the wafer. It is important to note that a gridistor is substantially symmetrical in relation to the median plane of the wafer parallel with its faces the cathode being on one side and the anode on the opposite side. As for the gate, the electrode connected thereto can be on either side of the wafer as desired. This property is turned to advantage in the invention.

The gridistor affords a very advanced miniaturization of structure, particularly as regards the grid internal geometry although the contacts have a relatively large surface. Another valuable feature is that of affording a high input resistance and a high output resistance, with the high transconductance of bipolar junction transistors.

Now it is known that, in general, field-effect semiconductor devices have the advantage, for the formation of integrated circuits, of having a considerably lower sensitivity to variations in temperature than that of bipolar transistors. The result is a substantial simplification in the circuits as a result of the omission of means of compensating for the effects of variation in the characteristics with the temperature, which indubitably facilitates the construction of the integrated circuits.

On the other hand, the high input resistance of the field-effect devices offers a certain advantage because the value of the capacitance of the connecting capacitors between amplifier stages can thus be considerably reduced in comparison with that which is necessary for bipolar transistors. The construction of such capacitors in the interior of the integrated circuit therefore becomes easy whereas that of the relatively large capacitances necessary for the connection between bipolar transistor stages involves difficulties.

Nevertheless, hitherto, the use of the field-effect devices had to be limited in practice to the input stage of the integrated circuit because of the relatively weak transconductance of these devices. These therefore had to be used in conjunction with bipolar transistors which greatly reduced the advantage obtained by their use. Because of its high transconductance, the gridistor constitutes the only type of active element in the integrated circuits of the invention.

According to another feature of the invention, the active elements of the integrated circuits are gridistors arranged successively head-to-tail, that is to say the electrodes having the same function in two succesive gridistors are on different faces of the plate or of the block constituting the integrated circuit. Since in electronic circuits comprising a plurality of active elements, the direct or capacitive connections take place between the gate of one element and the anode of the preceding element, it follows from the above arrangement that the connections will not necessitate passages from one face of the block to the other, or crossing on one and the same face between two circuit elements and that, in general, the connections between circuit elements became particularly easy.

The invention will be better understood and its characteristics and advantages made more clear on reading the detailed description which will now be given and on examining the accompanying drawings in which:

FIGS. 1, 2 and 3 recall the structure of a gridistor and show it seen respectively from one of its faces, from the other, and in section through an intermediate plane parallel with said faces;

As explained in the aforesaid U.S. patent application, the gridistor is essentially a field-effect device but which is likewise related, in its structure and in the physical process of its operation, to the device known as an analogue transistor (similar to a vacuum tube).

Figure 1:
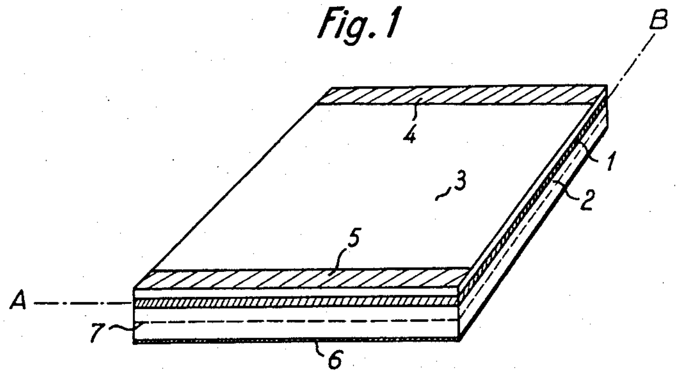

As illustrated in FIG. 1, a gridistor comprises a gate 1 of p-type semiconductor diffused into a plate 2 of n-type semiconductor material serving as a substrate and covered with a n-type layer 3, by epitaxial growth or by double diffusion, as explained fully in the patent application already cited.

Figure 3:
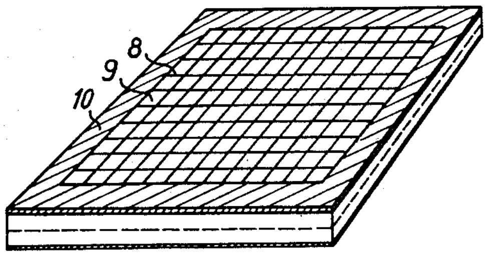

The gate is illustrated in FIG. 3 which is a section through the gridistor of FIG. 1 along the plane AB. The grid 1 does not occupy the whole of the surface of the wafer but is surrounded by a frame 10. This gate comprises rectilinear zones 8 in the form of a p-type grating surrounding meshes 9, here illustrated in square form, of n-type material like the whole of the plate 2. Meshes 9 extend in the direction perpendicular to the faces of the plate and constitute the rod-shaped zones referred to at the beginning. The p-type grid grating zones 8 surrounding the rods 9 are not as thin as indicated in idealized FIG. 3. It can be compared to the space between the rectilinear pipes of a heat exchanger, the rectilinear pipes of the heat exchanger simulating the rods of the gridistor. The rods form a plurality of conductor channels in parallel between the zones 2 and 3 and their effective section depends on the potential of the gate 1. The number of channels in parallel is very great and the result is a particularly high transconductance which may attain the order of one hundred ma. per volt for a surface of the order of one $mm.^2$.

The plate 2 is heavily doped with n-type impurities on its large face (the dotted line 7 shows the limits of the heavily doped zone) and an ohmic electrode 6 is vaporized onto the heavily doped portion. It was seen in the aforesaid patent application that the gate could be obtained by double diffusion, the one of a majority impurity with a low coefficient of diffusion, the other of a minority impurity with a much higher coefficient of diffusion, but from a lower superficial concentration, this later impurity being diffused through a perforated mask. In the deep zone where only the minority impurity reaches, the gate is formed, the superficial zone remaining of the majority type except at three sides of the gate frame. The n-type diffusion is effected above the site provided for the gate 1 and one side only of the frame 10 through a suitable slit (for example an aperture hollowed out of an oxide mask) and the p-type diffusion is effected above the site provided for the gate 1 and its frame 10. At the site provided for the gate and one side of the frame, the gate is formed in a deep zone and the superficial zone remains of n-type. Above the other three sides of the frame, the superficial zone becomes of p-type and is continued up to the gate. An ohmic electrode 4 in strip form, situated above the side of the frame subjected to the n-type diffusion and consequently remaining n-type at the surface, serves as a cathode, and an ohmic electrode 5 in strip form situated above the opposite side of the frame subjected only to the p-type diffusion serves as a gate electrode. It will be seen that although the gate is situated in a deep zone of the wafer 2, there is no need of any etching of the mesa type in order to connect an electrode thereto.

Figure 4:
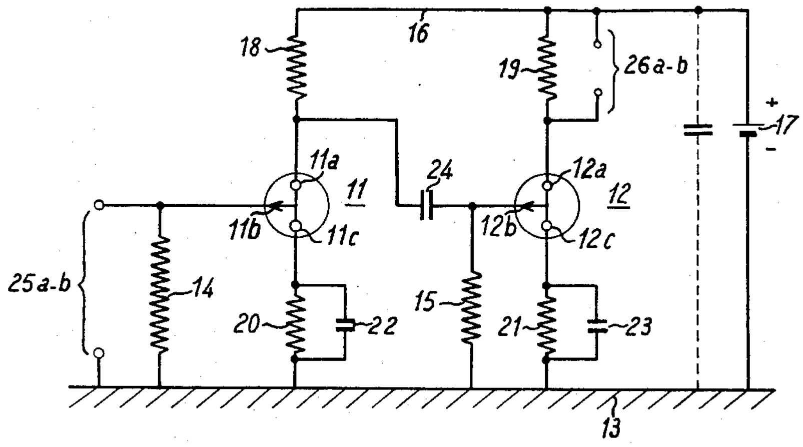
FIG. 4 shows the basic diagram of a gridistor amplifier which the invention enables to be produced in the form of an integrated circuit.

FIG. 4 shows a diagram of an amplifier which can easily be constructed in the form of a gridistor integrated circuit. This amplifier is composed of two stages each comprising a gridistor, respectively 11 and 12. Each gridistor comprises an anode, 11*a* and 12*a* respectively, a gate 11*b* and 12*b* and a cathode 11*c* and 12*c*.

The gates 11*b* and 12*b* are conected to the ground bar 13 by bias resistors 14 and 15 with a relatively high ohmic value of the order of a megohm. The anodes 11*a* and 12*a* are connected to the voltage-supply bar 16 connected to the source 17 by means of load resistors 18 and 19 of medium value, for example of the order of a few hundred ohms. The cathodes 11*c* and 12*c* are connected to the ground bar, each through a self-biasing resistor, the resistors 20 and 21 respectively, which are of a relatively low ohmic value, for example of the order of a few ohms to a few dozen ohms, shunted by capacitors 22 and 23.

The anode of the first stage is coupled to the gate of the second by a capacitor 24, of relatively low capacitance not exceeding the order of magnitude of 1000 pf. and generally of a substantially lower capacitance.

Finally the input terminals are indicated at 25*a* and *b* and the otuput terminals at 26*a* and *b*.

The source 17 is preferably shunted by a decoupling capacitor which is illustrated in dotted lines. This capacitor is only produced on one of the stages of the integrated circuit amplifier, preferably the last one, and it is not illustrated in FIGS. 5 and 6 which only relate to the first two stages of the amplifier.

Figure 5:
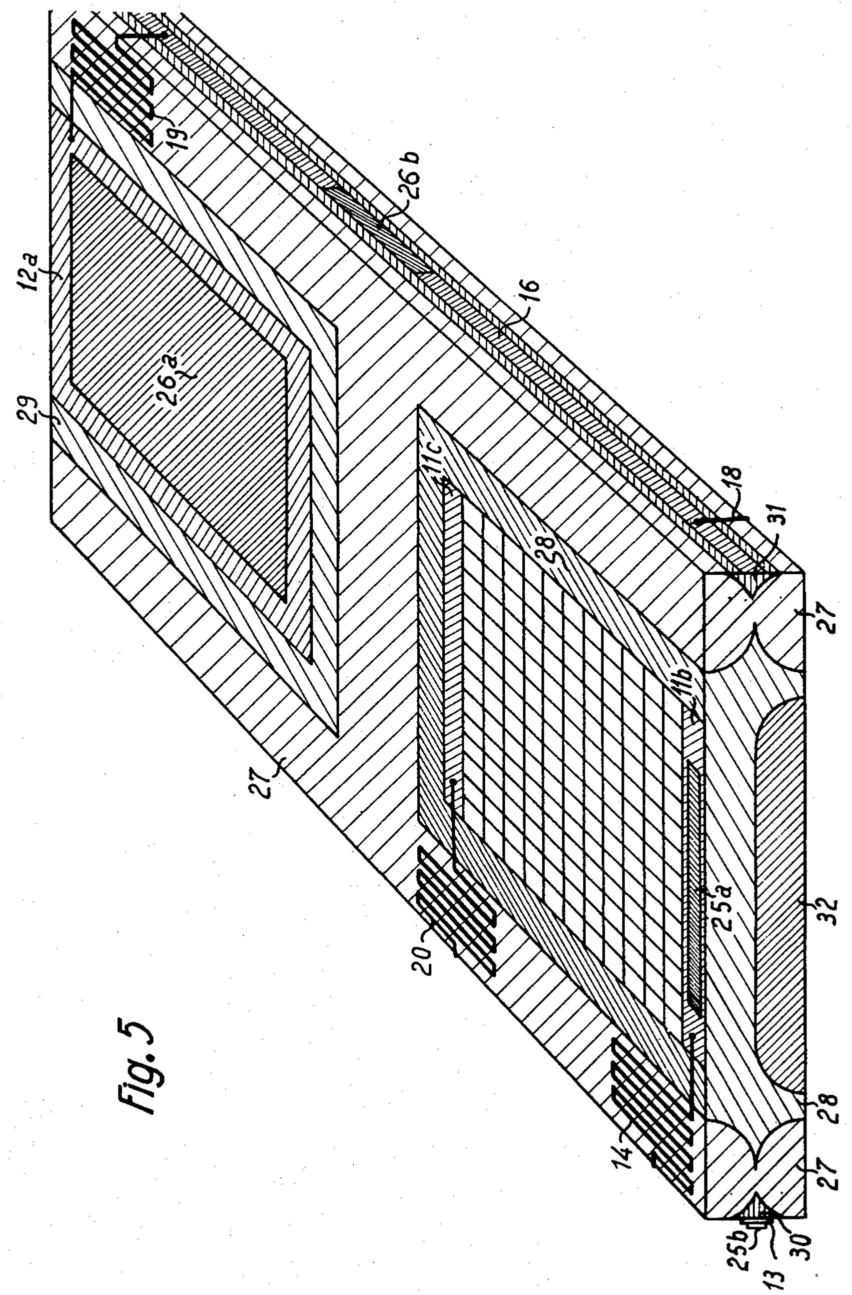
FIGS. 5 and 6 show the structure of the integrated circuit equivalent to the amplifier in FIG. 4, said structure being seen respectively from one face and from the opposite face.
Figure 6:
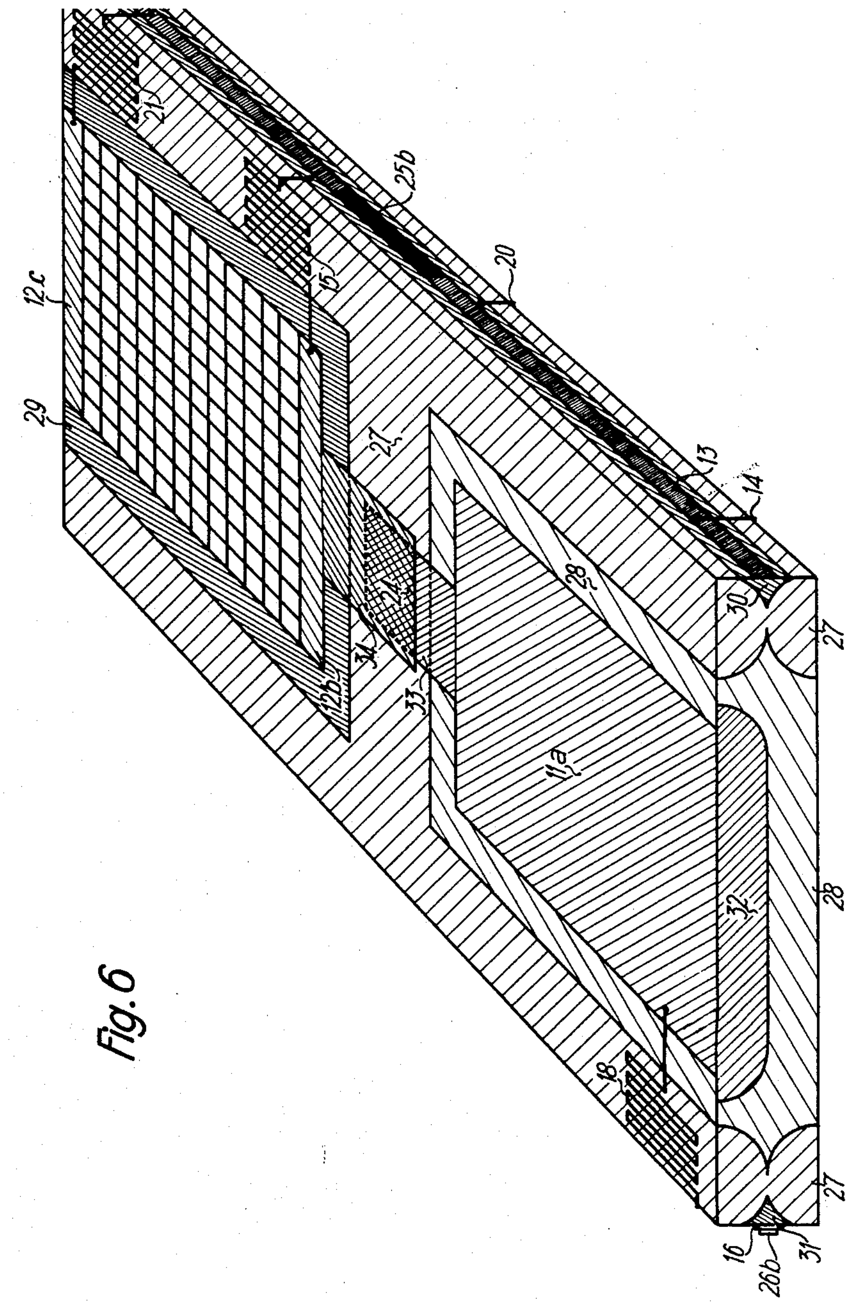

The embodiment of such an integrated circuit in a semiconductor unit is illustrated in FIGS. 5 and 6 which show this integrated circuit seen at its two opposite faces.

The base plate is a monocrystalline semiconductor for example of n-type silicon, and it has been divided into four separate n regions: 28, 29, 30 and 31 by diffussion, at a high temperature, of a p-type impurity (for example boron) from its two faces and through apertures hollowed out of an oxide mask in accordance with the usual technique, thus forming a p-type zone in the form of the letter H.

Figure 2:
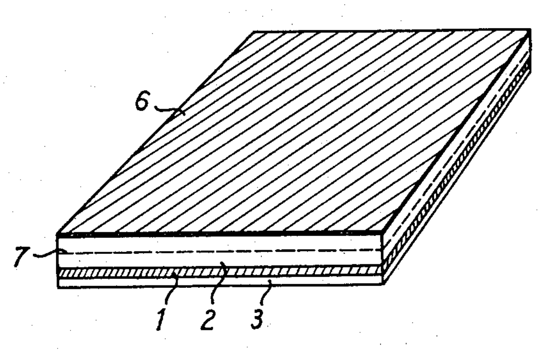

On the other hand, an n-type impurity (for example phosphorus) is diffused into the regions 28 and 29 in such a manner as to form a heavily doped $n^+$ layer in each. One of these layers is indicated at 32 in the region 28 and the other is developed from the opposite face in the region 29 but is not seen in the figures. In each of these same regions 28 and 29 a gridistor is formed by double diffusion as explained previously with reference to FIGS. 1 to 3, comprising an anode, a gate and a cathode, respectively 11*a*, *b*, *c* and 12*a*, *b*, *c* and arranged head-to-tail in relation to one another in accordance with one of the essential features of the invention.

It will be seen how greatly this particular arrangement facilitates the integrated construction in the semiconductor wafer of the connection between stages, that is to say the connection between the anode 11*a* and the gate 12*b* through the capacitor 24 as illustrated in FIG. 6. This capacitor is formed in the following manner: the $n^+$ zone 32 is extended at the surface by a square or rectangular tongue 33, diffused to a shallow depth, extending into the cross bar of the H of the p region 27. This tongue 33, which constitutes one of the plates of the capacitor 24, is covered with an insulating layer of silicon dioxide, extending beyond the tongue on both sides and forming the dielectric of the capacitor. This oxide layer is in turn covered by a metallized tongue 34, extending the gate electrode 12*b* and formed at the same time as this electrode.

The n-type regions 30 and 31, which are formed during the p-type diffusion in the edges of the large sides of the wafer, comprise respectively the ground bar 13 and the supply bar 16, both formed by metallization. Bar 13 is connected to the cathodes of the gridistors through the resistors 20 and 21 and to their gates through the resistors 14 and 15. Bar 16 is connected to the anodes of the gridistors through the resistors 18 and 19. These resistors are formed by superficial diffusion of an $n^+$ impurity (for example phosphorus as for the tongue 33), or possibly by deposition of a conducting ink for example colloidal carbon ink. It will be noted that the decoupling capacitors 22 and 23, in parallel with the self-biassing resistors 20 and 21 according to the diagram in FIG. 4, are not explicity realized in FIGS. 5 and 6. Nevertheless they are implicitly so, however, as a result of the capacitance distributed between the resistor 20 (or 21) and the region 27 (p region) in which this resistance is diffused or onto which it is deposited. Finally the input and output terminals are illusrated respectively at 25*a* and *b* and at 26*a* and *b*. Only these terminals are accessible and comprises connections outside the integrated circuit (not illustrated in the figures). Purely by way of indication, the circuit of FIGS 5 and 6 can be embodied in a volume of $(2\times1\times0.1)$ mm.$^3$.

Figure 7:
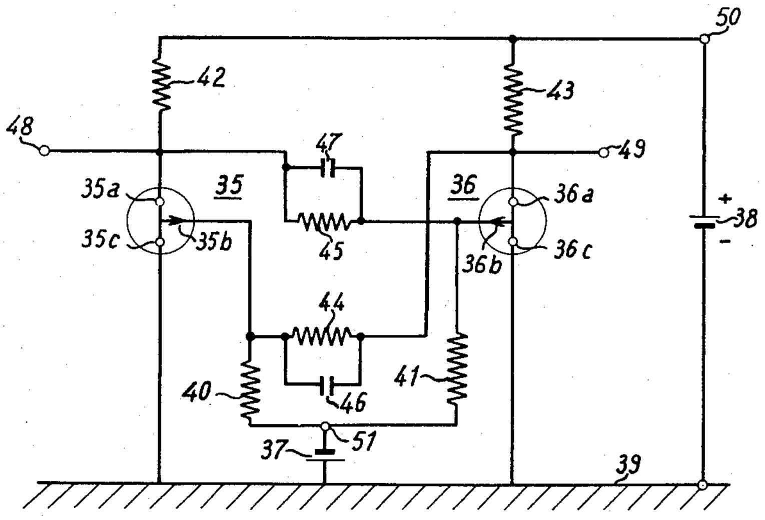
FIG. 7 illustrates the theoretical diagram of a gridistor trigger which the invention enables to be produced in the form of an integrated circuit.

FIG. 7 shows another example of a circuit diagram which can be embodied in the form of an integrated circuit according to the invention. The diagram of a conventional trigger circuit will be recognized in which active elements are gridistors 35 and 36 comprising anode, gate and cathode, respectively 35*a*, *b*, *c* and 36*a*, *b*, *c*. The trigger is fed by the sources 37 and 38 connected in series, their common point being connected to the ground bar 39. The source 37 ensures the biasing of the gates through resistors 40 and 41, of the order of a few tens of thousands of ohms. This resistance value is small in relation to the gate-cathode input resistance in the blocked condition, the gate-cathode junction operating in the inverse direction in such a manner that substantially the whole of the bias voltage is then applied between the gate and the cathode, blocking the passage of the current. On the other hand, this resistance is very great in comparison with the gate-cathode resistance in the conducting state, the junction then operating in the forward direction, the source 37 in no way hampering the free passage of the anode current.

The anode resistances 42 and 43 are of the order of a few hundred to about a thousand ohms. As for the crossed connections between the gate 35*b* and the anode 36*a* and reciprocally, between the anode 35*a* and the gate 36*b*, these are afforded by resistances 44 and 45 shunted respectively by capacitors 46 and 47. The resistances may have a value of the order of a few tens of thousands of ohms and the capacitors a capacitance of the order of a few pf. Finally the trigger comprises signal input and output terminals 48 and 49, as well as the anode supply terminal 50, ground terminal 39 and bias terminal 51.

Figure 8:
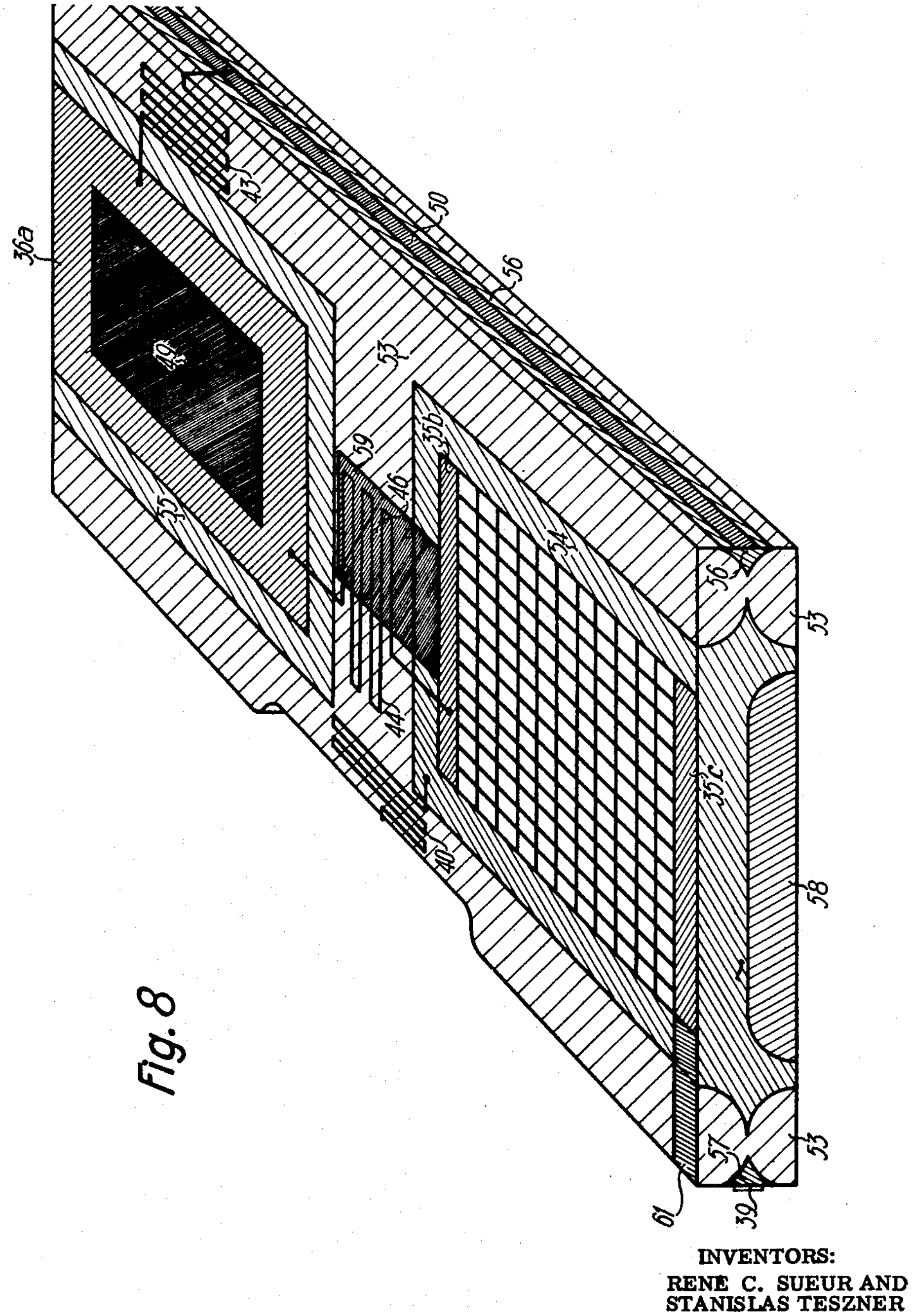
FIGS. 8 and 9 show the structure of the integrated circuit equivalent to the trigger of FIG. 7, said structure being seen respectively from one face and from the opposite face.
Figure 9:
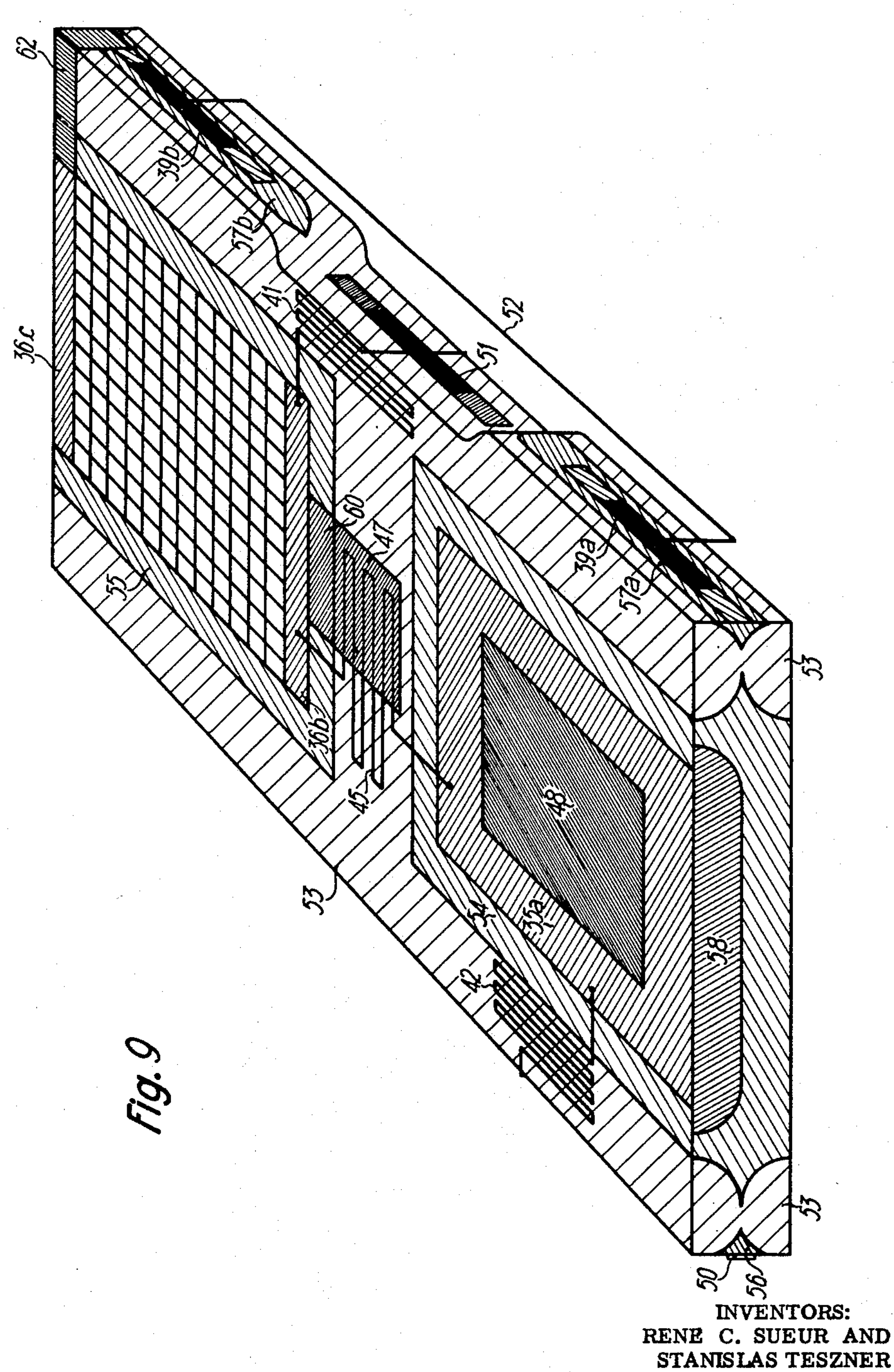

The embodiment of such a trigger is illustrated in FIGS. 8 and 9. It is very similar to the embodiment of the amplifier as shown in FIGS. 5 and 6 except that the need to insert the biasing bar 51 leads to cutting the ground bar 39 and profiling the corresponding edge of the wafer in such a manner as to provide a seating for this bar 51 in the p-region, insulated from the n-regions of the two sections of the ground bar 39. It follows that these two sections 39*a* and *b* have to be connected by an external connection 52.

This being so, starting, always by way of example, with a wafer of monocrystalline n-type silicon, the p region 53 is diffused, in the shape of the letter H, delimiting four n-type regions, comprising two central regions 54 and 55 on and within the broad faces of the wafer where the gridistors will be formed and two lateral regions 56 and 57 on and within the small faces of the wafer adapted to contain the supply and ground bars 50 and 39 respectively. The lateral region 57 is then divided into two 57*a* and 57*b* by electrolytic or chemical etching. Then a heavily doped $n^+$ zone is formed in the regions 54 and 55, only one of these zones being seen at 58, and the gridistors 35*a*, *b*, *c* and 36*a*, *b*, *c* are formed as explained previously.

The resistances 40, 41, 42, 43, 44 and 45 are then diffused and the capacitors 45 and 46 formed by covering the resistances 44 and 45 with a layer of silicon dioxide and then by extending the gate contacts 35*b* and 36*b* into tongue-shaped portions 59 and 60 respectively. The fabrication is completed by metallic deposition of the contact bars 50, 51 and 39*a* and *b*, these latter being connected by a connection 52 as already indicated, and of the connections 61 and 62 between the cathodes 35*c* and 36*c* and the ground bars 39*a* and *b*. It is an advantage to insulate these connections 61 and 62 from the p-type frame by a silicon-oxide layer. For this purpose, prior to any metallization, the whole circuit is covered with oxide and then the apertures corresponidng to the anode, gate and cathode contacts, as well as the ground and supply bars are formed therein. It is inside these apertures that the metallized layers are deposited, being supplemented by the tongues 59 and 60 and the connections 61 and 62 deposited on the oxide layer.

The dimensions of the trigger thus described are of the same order as those of the amplifier of FIGS. 5 and 6, namely (2 x 1 x 0.1) mm.$^3$.

The embodiments of the integrated circuits described in FIGS. 5 and 6 on the one hand and FIGS. 8 and 9 on the other hand are obviously capable of several modifications.

Thus in order to admit a higher supply voltage, the resistors which are then produced by depositing ink, may be insulated from the semiconductor support by an oxide layer. In another modification, in which the technique of forming the resistors by diffusion is retained, a semiconductor layer of the same type but having a substantially higher resistivity is first deposited on the p-type frame, for example by epitaxial growth, affording a considerably improved behaviour in the reverse direction of the n–p junction formed by the resistor and the semiconductor support. The resistors may likewise be produced not by diffusion but by evaporation of a thin metallic film. The inductive elements, if the circuit comprises any, may be produced by depositing a ferromagnetic layer on the semiconductor crystal and vaporizing a metallized spiral on this layer.

These modifications facilitate the extension of the structure according to the invention to more complex diagrams with gridistors arranged alternately head-to-tail. The p-type frames in the form of a letter H, being reproduced in succession, form a general frame in the form of a ladder.

Nevertheless, it is understood that more complex circuits could likewise be formed by a simple juxtaposition of the elemental simple circuits such as those according to FIGS. 5 and 6 and FIGS. 8 and 9, or other basic diagrams.

It is likewise understood that the invention is not restricted to the only material specified (silicon) but that other materials such as germanium or the intermetallic compounds of groups III and V of the periodic table of elements could be used. Finally, the forms of embodiment may vary without therefore departing from the scope of the invention as defined in the appending claims.

What we claim is:

1. An integrated circuit comprising a parallelepiped semi-conductor wafer having two rectangular faces, a p-type H-shaped region in said wafer, said p-type region including two rectilinear longitudinal regions along the sides of the wafer and a third rectilinear region transverse thereto, two first n-type regions on both sides of said p-type transverse region, two second n-type regions in the edges of the wafer parallel to said p-type longitudinal regions, in each of said first n-type regions, an active field-effect element including a plurality of internal rod-shaped n-type regions substantially perpendicular to the faces of the wafer, embedded in an internal p-type layer and integral with n-type superficial layers on the faces of the wafer, said active elements being structurally symmetrical with respect to the median plane of the wafer, source and gate electrodes for each active field-effect element respectively connected to one superficial and to the internal layers, a drain electrode for each active element connected to the other superficial layer, the drain electrode of one active element being on the same face as the source and gate electrodes of the other active element and adjacent to said gate electrode of said other element, at least a coupling element integrated in said wafer connected between the drain electrode of one active element and the gate electrode of the other, a supply bar and a ground bar respectively metallized onto said two second n-type regions, and integrated resistors connected between said drain electrodes and said supply bar and between said source and gate electrodes and said ground bar.

2. An integrated circuit comprising a parallelepiped semi-conductor wafer having two rectangular faces, an n-type H-shaped region in said wafer, said n-type region including two rectilinear longitudinal regions along the sides of the wafer and a third rectilinear region transverse thereto, two first p-type regions on both sides of said n-type transverse region, two second p-type regions in the edges of the wafer parallel to said n-type longitudinal regions, in each of said first p-type regions, an active field-effect element including a plurality of internal rod-shaped p-type regions substantially perpendicular to the faces of the wafer, embedded in an internal n-type layer and integral with p-type superficial layers on the faces of the wafer, said active elements being structurally symmetrical with respect to the median plane of the wafer, source and gate electrodes for each active field-effect element respectively connected to one superficial and to the internal layers, a drain electrode for each active element connected to the other superficial layer, the drain electrode of one active element being on the same face as the source and gate electrodes of the other active element and adjacent to said gate electrode of said other element, at least a coupling element integrated in said wafer connected between the drain electrode of one active element and the gate electrode of the other, a supply bar and a ground bar respectively metallized onto said two second p-type regions, and integrated resistors connected between said drain electrodes and said supply bar and between said source and gate electrodes and said ground bar.

3. An integrated circuit according to claim 1 comprising two coupling elements integrated in the semiconductor wafer, one on a given face thereof connected between the drain electrode of the first active element and the gate electrode of the second and the other on the opposite face thereof connected between the drain electrode of the second active element and the gate electrode of the first.

4. An integrated circuit according to claim 2 comprising two coupling elements integrated in the semiconductor wafer, one on a given face thereof connected between the drain electrode of the first active element and the gate electrode of the second and the other on the opposite face thereof connected between the drain electrode of the second active element and the gate electrode of the first.

5. An integrated circuit comprising an elongated parallelepiped semi-conductor wafer having two rectangular faces, a ladder-shaped region of a given type of conductivity in said wafer, said region including two rectilinear longitudinal regions along the sides of the wafer and a plurality of rectilinear regions transverse thereto, a plurality of $2n$ first regions of the opposite type of conductivity to said given conductivity, longitudinally spaced apart and separated from one another by said transverse regions of the given type of conductivity, $n$ being an integer, two second regions of said opposite type of conductivity in the edges of the wafer parallel to said longitudinal regions, in each of said first regions of said opposite type of conductivity an active field-effect element including a plurality of internal rod-shaped regions of said opposite type of conductivity substantially perpendicular to the faces of the wafer, embedded in an internal layer of said given type of conductivity and integral with superficial layers of said opposite type of conductivity on the faces of the wafer, said active elements being structurally symmetrical with respect to the median plane of the wafer, whereby the active elements form a series of longitudinally spaced apart elements numbered from 1 to $2n$ along the length of the elongated wafer, source and gate electrodes for the active field-effect elements of numbers 1, 3 . . . $(2n-1)$ in said series and drain electrodes for the active field-effect elements of numbers 2, 4 . . . $2n$ in said series on one face of the wafer, source and gate electrodes for the active field-effect elements of 2, 4 . . . $2n$ in said series and drain electrodes for the active field-effect elements of numbers 1, 3 . . . $(2n-1)$ in said series on the other face of the wafer, said source and drain electrodes being respectively connected to said superficial layers and said gate electrodes to said internal layers, at least $(2n-1)$ coupling elements integrated in said wafer connected between the drain electrode of the active elements of numbers 1, 3 . . . $(2n-1)$ to the gate electrode of the active elements of numbers 2, 4 . . . $2n$ and located on one face of the wafer and between the drain electrode of the active elements of numbers 2, 4 . . . $2n$ to the gate electrode of the active elements of numbers 1, 3 . . . $(2n-1)$ and located on the other face of the wafer, a supply bar and a ground bar respectively metallized onto said two second regions of said opposite type of conductivity and integrated resistors connected between said drain electrodes and said supply bar and between said source and gate electrodes and said ground bar.

6. A solid circuit according to claim 5 wherein the number $n$ is equal to an integer plus half.

References Cited by the Examiner

UNITED STATES PATENTS

| | | | |
|---|---|---|---|
| 3,005,937 | 10/61 | Wallmark et al. | 317—235 |
| 3,029,366 | 4/62 | Lehovec | 307—88.5 |
| 3,130,377 | 4/64 | Brown et al. | 307—88.5 |
| 3,134,912 | 5/64 | Evans | 307—88.5 |

JOHN W. HUCKERT, *Primary Examiner.*

ARTHUR GAUSS, *Examiner.*